US007999448B2

(12) United States Patent
Feltz et al.

(10) Patent No.: US 7,999,448 B2
(45) Date of Patent: Aug. 16, 2011

(54) PIEZOELECTRIC MATERIAL, MULTILAYER ACTUATOR AND METHOD FOR MANUFACTURING A PIEZOELECTRIC COMPONENT

(75) Inventors: Adalbert Feltz, Deutschlandsberg (AT); Michael Schossmann, Frauental (AT); Patrick Schmidt-Winkel, Bad Gams (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/552,528

(22) Filed: Sep. 2, 2009

(65) Prior Publication Data

US 2010/0066214 A1 Mar. 18, 2010

Related U.S. Application Data

(63) Continuation of application No. PCT/EP2008/052385, filed on Feb. 27, 2008.

(30) Foreign Application Priority Data

Mar. 2, 2007 (DE) ........................ 10 2007 010 239

(51) Int. Cl.
*H01L 41/08* (2006.01)

(52) U.S. Cl. ................ 310/358; 310/328; 352/62.9 PZ; 29/25.35

(58) Field of Classification Search .................. 310/358, 310/359; 252/62.9 PZ; 29/25.35
See application file for complete search history.

(56) References Cited

U.S. PATENT DOCUMENTS

| | | | |
|---|---|---|---|
| 4,581,159 | A | 4/1986 | Hennings et al. |
| 4,692,289 | A | 9/1987 | Hennings et al. |
| 5,433,917 | A | 7/1995 | Srivastava et al. |
| 5,792,379 | A | 8/1998 | Dai et al. |
| 6,182,340 | B1 | 2/2001 | Bishop |
| 6,230,378 | B1 | 5/2001 | Cramer et al. |
| 6,692,651 | B2 | 2/2004 | Helke |
| 6,979,410 | B2 | 12/2005 | Sasaki |
| 7,504,042 | B2 | 3/2009 | Kawada et al. |
| 2003/0207150 | A1 | 11/2003 | Maria et al. |
| 2005/0115039 | A1 | 6/2005 | Okuda et al. |
| 2005/0258718 | A1 | 11/2005 | Bodinger et al. |
| 2007/0158608 | A1 | 7/2007 | Feltz et al. |
| 2008/0245991 | A1 | 10/2008 | Bamiere et al. |

FOREIGN PATENT DOCUMENTS

| | | | |
|---|---|---|---|
| DE | 198 40 488 | A1 | 3/1999 |
| DE | 10 2004 002 204 | A1 | 8/2005 |
| EP | 0 065 806 | A2 | 12/1982 |
| JP | 7-277822 | A | 10/1995 |
| JP | 2001-342062 | A | 12/2001 |
| WO | WO 2005/069396 | A1 | 7/2005 |
| WO | WO 2006/038389 | A1 | 4/2006 |
| WO | WO 2007/074095 | A1 | 7/2007 |

OTHER PUBLICATIONS

Leshchenko, P., et al., "The System SrO-$Nb_2O_5$," (English Translation) Izvestiya Akademii Nauk SSSR, Neorganicheskie Materialy, vol. 18, No. 7, pp. 1202-1205, Jul. 1982, 4 pages, Plenum Publishing Corporation.

Schuh, C., et al., "AG Doping of Rare Earth Modified PZT," Proceedings of the International Conference on Electroceramics & Applications, Electroceramics V; Sep. 2-4, 1996, pp. 201-204, Aveiro, Portugal, European Ceramic Society.

Hammer, M., et al., "Detailed X-ray Diffraction Analyses and Correlation of Microstructural and Electromechanical Properties of La-doped PZT Ceramics," Journal of Electroceramics, vol. 2, No. 2, Mar. 1998, 9 pages, Kluwer Academic Publishers.

Uchino, K., "Recent Trend of Piezoelectric Actuator Developments," Proceedings of the International Symposium on Micromechatronics and Human Science (MHS '99), Nov. 23-26, 1999, 7 pages, Nagoya, Japan, IEEE.

Garg, A., et al., "Effect of rare earth (Er, Gd, Eu, Nd and La) and bismuth additives on the mechanical and piezoelectric properties of lead zirconate titanate ceramics," Materials Science and Engineering B, vol. 86, No. 2, Sep. 25, 2001, 10 pages, Elsevier Science BV.

Kato, T., et al., "Effects of Dopant $Nb^{+5}$ on Lead Zirconate-Titanate," Ferroelectrics, vol. 134, 1992, 6 pages, Gordon and Breach Science Publishers S.A., USA.

*Primary Examiner* — Mark Budd
(74) *Attorney, Agent, or Firm* — Slater & Matsil, L.L.P.

(57) ABSTRACT

A piezoelectric material contains a material with the molecular formula $P_{1-c-d}D_cZ_d$, wherein: $0<c\leqq 0.15$ and $0\leqq d\leqq 0.5$, wherein P represents the composition $Pb(Zr_{1-y}Ti_y)O_3$ and wherein: $0.50\leqq 1-y\leqq 0.60$, wherein Z represents an additional component of the perovskite type of structure, wherein D represents a material according to the general formula $[(M_1O)_{1-p}(M_2O)_p]_a[Nb_2O_5]_{1-a}$, wherein $M_1$ represents $Ba_{1-t}Sr_t$ with $0\leqq t\leqq 1$ and $M_2$ represents strontium or calcium and wherein: $2/3<a<1$ and $0<p<1$, wherein the material D contains the cryolite type of structure.

41 Claims, No Drawings

PIEZOELECTRIC MATERIAL, MULTILAYER ACTUATOR AND METHOD FOR MANUFACTURING A PIEZOELECTRIC COMPONENT

This application is a continuation of co-pending International Application No. PCT/EP2008/052385, filed Feb. 27, 2008, which designated the United States and was not published in English, and which claims priority to German Application No. 10 2007 010 239.0 filed Mar. 2, 2007, both of which applications are incorporated herein by reference.

TECHNICAL FIELD

The invention relates to a piezoelectric material that is suitable for manufacturing piezoelectric components with internal electrodes. The invention further pertains to a piezoelectric multilayer actuator and method for manufacturing a piezoelectric component.

BACKGROUND

A piezoelectric ceramic material is known from the publication DE 10 2004 002 204 A1 and U.S. equivalent publication 2007/0158608.

SUMMARY

In one aspect, the present invention specifies a piezoelectric material that is well suited for application in piezoelectric multilayer actuators.

A ceramic material that is based on PZT (lead zirconate titanate) is described. In one example, a piezoelectric material comprises a material with the molecular formula $P_{1-c-d}D_cZ_d$, where $0<c\leqq 0.15$ and $0\leqq d\leqq 0.5$. In this formula, P represents the composition $Pb(Zr_{1-y}Ti_y)O_3$, where $0.50\leqq 1-y\leqq 0.60$, Z represents an additional component of the perovskite type of structure, and D represents a material according to the general formula $[(M_1O)_{1-p}(M_2O)_p]_a[Nb_2O_5]_{1-a}$. $M_1$ represents $Ba_{1-t}Sr_t$ with $0\leqq t\leqq 1$ and $M_2$ strontium, and wherein: $2/3<a<1$ and $0<p<1$. Preferably, the material D contains the cryolite type of structure.

DETAILED DESCRIPTION OF ILLUSTRATIVE EMBODIMENTS

The use of piezoelectric components as actuators places high requirements for reliability as well as temporal and thermal stability, especially in automotive engineering. In addition, this use demands high dynamic actuator deviations in combination with a high blocking force that result when an electrical potential is applied to the actuator. Particularly suitable materials are piezoelectric ceramics based on lead zirconate titanate ($Pb(Zr_{1-y}Ti_y)O_3$, PZT). In the case of PZT ceramics, the desired piezoelectric material properties are achieved initially by adjusting a defined quantity ratio between zirconium (Zr) and titanium (Ti) in the perovskite structure ($ABO_3$-type) of PZT corresponding to the general formula $Pb(Zr_{1-y}Ti_y)O_3$. Particularly advantageous piezoelectric properties are achieved with PZT materials if the Zr/Ti ratio lies in the area of the so-called morphotropic phase boundary (MPB). Therefore, PZT materials according to $Pb(Zr_{1-y}Ti_y)O_3$, with $y\approx 0.45$-$0.50$, are preferably selected. In addition, the material properties of PZT can be adjusted very extensively and specifically for the respective application by the addition of certain materials that can dissolve in the perovskite structure of PZT, and are referred to as doping materials or dopants. The modification of a PZT material can be achieved, for example, by substitution of Pb at A-sites (Pb sites) and/or by substitution of the Zr/Ti system B-sites (Zr/Ti sites) with suitable elements or suitable combinations of elements. Not lowering the comparatively high Curie temperature $T_C$ of $\approx 360°$ C. too sharply by such material modifications is particularly advantageous for the thermal stability of piezoelectric PZT materials. This is successfully accomplished particularly by keeping the concentration of the additives or dopants as small as possible.

The piezoelectric material described here contains, in addition to the PZT base material, an additive present in the form of such a dopant. With the aid of an additive to the PZT base material, lattice sites of the PZT base lattice can be occupied by materials other than those predefined by PZT, whereby the electrical and mechanical properties of the material can be favorably influenced. The dopant is preferably present in the piezoelectric material in a proportion of up to 2.5 mol %. It is particularly preferred if a mixed crystal, wherein the lead zirconate titanate and the dopant form a solid solution, forms from the PZT base material and the dopant. In particular, the installation of cations at B-sites of the PZT host lattice is possible by doping PZT, whereby the electrical properties of the material can be particularly extensively improved.

As a dopant, a ceramic material considered particularly preferable is one that corresponds to the general formula $[(M_1O)_{1-p}(M_2O)_p]_a[Nb_2O_5]_{1-a}$, wherein $M_1$ represents $Ba_{1-t}Sr_t$ with $0\leqq t\leqq 1$ and $M_2$ represents strontium or calcium and wherein: $2/3<a<1$ and $0<p<1$.

The installation of $M_2$ cations at formal B-sites of the perovskite host lattice is possible with the aid of the specified mixture of PZT and the dopant of the specified formula. This is true particularly because the PZT base material and the dopant form a mixed crystal. The composition $Pb(Zr_{1-y}Ti_y)O_3$ is considered particularly favorable wherein as the PZT base material: $0.50\leqq 1-y\leqq 0.60$, and wherein the host lattice corresponds to the lattice $ABO_3$ of the perovskite type. By selecting the parameter 1−y to be between 0.5 and 0.6, the zirconium/titanium ratio is adjusted to the area of the so-called morphotropic phase boundary, which brings about particularly good properties of the ceramic material.

According to another embodiment of the piezoelectric material, an extra component of the perovskite type of structure can additionally be contained up to a proportion of 50 mol %.

The dopant can contain the cryolite type of structure, whereby a particularly good solubility of the dopant or parts of the dopant in the PZT host lattice results.

The dopant can be present in the host lattice as a compound with a cryolite structure in solid solution.

With respect to the dopant, three different stoichiometric compositions or parameter ranges can be distinguished:

in parameter range 1: $6/7<a<1$, in parameter range 2: $2/3<a<4/5$, and in parameter range 3: $4/5\leqq a\leqq 6/7$ and $1/4\leqq p\leqq 1/3$.

In parameter range 3, a formulation of a compound with cryolite structure results for the dopant for the case in which the parameter p correlated with the parameter a varies, specifically, according to the relationship $a=22/35+24p/35$, which produces a connection between a and p. The general formula for the underlying cryolite system is:

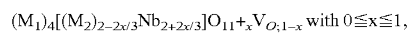

$$(M_1)_4[(M_2)_{2-2x/3}Nb_{2+2x/3}]O_{11}+_xV_{O;1-x} \text{ with } 0\leqq x\leqq 1,$$

wherein it holds for the relationship between a and the parameter x that:

$$a=6/7-2x/35.$$

The cryolite compound has a phase range corresponding to the range of variation $0 \leqq x \leqq 1$ and the presence of oxygen vacancies ($V_O$). Moreover, the cryolite structure corresponds very closely to the closely related PZT perovskite host lattice. Both ceramic materials can form a mixed-crystal system in which the components of the dopant are inserted onto the lattice sites of the PZT lattice. They thus form a solid solution, i.e., in the perovskite phase, vacancies on the oxygen sites occur in the range $x<1$, and $M_2$ is installed onto the B-sites of the uniform perovskite phase.

In the case where $M_1=M_2=Sr$, strontium cations are installed on the B-sites of the perovskite phase.

In parameter range 1, the existing excess of $\{M_1O$ and/or $M_2O\}$, in the boundaries of $1/7$ (for a=1) and 0 (for $a=6/7$), enters into a chemical reaction with the PZT host lattice.

For the excess of alkaline-earth oxide, the ratio of $M_1$ to $M_2$ can be varied arbitrarily according to $0<p<1$, and the following reactions can occur:

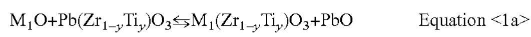

$$M_1O+Pb(Zr_{1-y}Ti_y)O_3 \leftrightarrows M_1(Zr_{1-y}Ti_y)O_3+PbO \qquad \text{Equation <1a>}$$

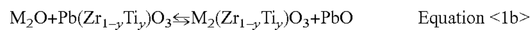

$$M_2O+Pb(Zr_{1-y}Ti_y)O_3 \leftrightarrows M_2(Zr_{1-y}Ti_y)O_3+PbO \qquad \text{Equation <1b>}$$

The PbO can be forced out of the PZT host lattice with the aid of these reactions, and an equivalent amount $M(Zr_{1-y}Ti_y)O_3$ is formed, where M represents $M_1$ or $M_2$. These zirconium titanates that are formed can likewise dissolve in the PZT host lattice, forming a mixed crystal. In addition, lead oxide is produced which slightly further increases the content of any sintering aid that may already be present in the system. Said reaction can run until $a=6/7$ is reached. In this case, an amount of $M_1O$ and/or $M_2O$ equivalent to the $Nb_2O_5$ content is present in the material, and with $p=1/3$, the solid solution of the cryolite with the limit composition $(M_1)_4[(M_2)_2Nb_2]O_{11}V_{O;1}$ in the PZT host lattice results. The solid solution contains $M_2$ cations at B-sites of the perovskite mixed crystal and oxygen vacancies.

The limit composition corresponds to the parameter x=0 corresponding to one side of the phase range of the cryolite system. In this case, the oxygen vacancy concentration is relatively high.

For the case where $M_1=M_2$, there is an excess of strontium oxide in the boundaries $0<\{SrO\}<1/7$. The displacement of PbO from the PZT host lattice runs according to the following reaction equation:

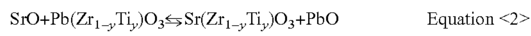

$$SrO+Pb(Zr_{1-y}Ti_y)O_3 \leftrightarrows Sr(Zr_{1-y}Ti_y)O_3+PbO \qquad \text{Equation <2>}$$

With the aid of this reaction, an equivalent amount of $Sr(Zr_{1-y}Ti_y)O_3$ is formed, which dissolves in the PZT host lattice, forming a mixed crystal. An amount of SrO equivalent to the $Nb_2O_5$ content, corresponding to an excess of strontium oxide of 0, results in the formation of a solid solution of the cryolite compound with the limit composition $Sr_4(Sr_2Nb_2)O_{11}V_{O;1}$ in the PZT host lattice, according to the other side of the phase range in the cryolite system. The solid solution contains Sr cations at B-sites of the perovskite mixed crystal and oxygen vacancies.

In parameter range 2, there is an excess of niobium oxide $\{Nb_2O_5\}$ in the range $1/5>\{Nb_2O_5\}>0$, which leads, as a consequence of the binding of sintering aid PbO possibly present in the system or added to it, according to:

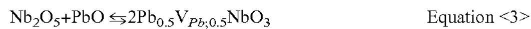

$$Nb_2O_5+PbO \leftrightarrows 2Pb_{0.5}V_{Pb;0.5}NbO_3 \qquad \text{Equation <3>}$$

to the formation of an equivalent amount of lead niobate. The lead niobate can likewise dissolve in the PZT lattice, forming a mixed crystal, wherein the formation of lead vacancies $V_{Pb}$ occurs at the Pb sites of the PZT host lattice. If the parameter $p=1/4$ is satisfied, then a content of $Nb_2O_5$ equivalent to the $M_1O$ or $M_2O$ content, corresponding to $a=4/5$, results in the formation of a solid solution of the cryolite compound with the limit composition $(M_1)_4[(M_2)_{4/3}Nb_{8/3}]O_{12}$ in the PZT host lattice, according to the other side of the phase range of the cryolite system, wherein in this case, $M_2$ cations continue to be present on B-sites of the perovskite mixed crystal, but the oxygen vacancies are eliminated.

For the case of $M_1=M_2=Sr$, the parameter p is unnecessary and in the case of a content of $Nb_2O_5$ equivalent to the strontium oxide content, there results the formation of a solid solution of the cryolite compound with the limit composition $Sr_4(Sr_{4/3}Nb_{8/3})O_{12}$ according to the other side of the phase range of the cryolite system, wherein no oxygen vacancies are present, but the B-sites of the perovskite mixed crystal still contain Sr cations.

It is true in general of all the piezoelectric materials described here that they can additionally contain up to 5 mol % of PbO. This lead oxide can serve, for example, as an auxiliary agent in the sintering of the ceramic material.

According to a particularly preferred embodiment of the material, the dopant contains a cryolite compound of the formula $(M_1)_4[(M_2)_2Nb_2]O_{11}V_{O;1}$, which forms a solid solution with the PZT host lattice.

In general, the piezoelectric material can be described with the summary formula $P_{1-c-d}D_cZ_d$, where, $$0<c \leqq 0.15 \text{ and } 0 \leqq d \leqq 0.5.$$

Here the subranges $0<c \leqq 0.025$ and $0.0255<c<0.0443$ are possible for c. Here P represents the PZT base material, D the dopant with the general composition $[(M_1O)_{1-p}(M_2O)_p]_a[Nb_2O_5]_{1-a}$, and Z an additional component of the perovskite type of structure.

The cryolite compound of the formula $(M_1)_4[(M_2)_2Nb_2]O_{11}V_{O;1}$ can be a constituent of component D, wherein the excess of MO of component D is reacted with component P to $M(Zr_{1-y}Ti_y)O_3$ and PbO, wherein M represents $M_1$ or $M_2$.

According to another embodiment of the material, the dopant can contain a cryolite compound of the formula $(M_1)_4[(M_2)_{4/3}Nb_{8/3}]O_{12}$, which forms a solid solution with the PZT host lattice. The cryolite compound can be a constituent of component D, with an excess of $Nb_2O_5$ of component D being reacted with PbO additionally present in the ceramic material into lead niobate.

According to one embodiment of the material, $M(Zr_{1-y}Ti_y)O_3$ can be contained in the material as the product of a reaction of the above-described cryolite system with component P, where M represents $M_1$ or $M_2$.

Due to the dopants that are present only in small amounts, an interaction and reaction with the PZT host lattice, preset in a large excess, can come about for the cryolite compound. In this manner, a considerable modification of the oxygen vacancy concentration in the entire material system can be achieved.

Due to the greater basicity of the alkaline-earth component in the dopant, the mixed crystal formation of the dopant with the PZT host lattice includes the possibility of displacement of PbO from the PZT. This is true particularly in the range of formulating a solid solution of a compound from the above-described cryolite system in the PZT host lattice. The reactions coming into consideration read as follows:

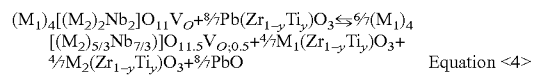

$$(M_1)_4[(M_2)_2Nb_2]O_{11}V_O+8/7Pb(Zr_{1-y}Ti_y)O_3 \leftrightarrows 6/7(M_1)_4[(M_2)_{5/3}Nb_{7/3})]O_{11.5}V_{O;0.5}+4/7M_1(Zr_{1-y}Ti_y)O_3+4/7M_2(Zr_{1-y}Ti_y)O_3+8/7PbO \qquad \text{Equation <4>}$$

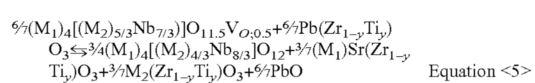

$$6/7(M_1)_4[(M_2)_{5/3}Nb_{7/3})]O_{11.5}V_{O;0.5}+6/7Pb(Zr_{1-y}Ti_y)O_3 \leftrightarrows 3/4(M_1)_4[(M_2)_{4/3}Nb_{8/3}]O_{12}+3/7(M_1)Sr(Zr_{1-y}Ti_y)O_3+3/7M_2(Zr_{1-y}Ti_y)O_3+6/7PbO \qquad \text{Equation <5>}$$

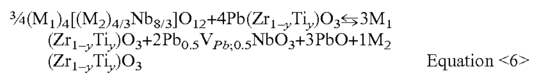

$$\tfrac{3}{4}(M_1)_4[(M_2)_{4/3}Nb_{8/3}]O_{12}+4Pb(Zr_{1-y}Ti_y)O_3 \leftrightarrows 3M_1(Zr_{1-y}Ti_y)O_3+2Pb_{0.5}V_{Pb;0.5}NbO_3+3PbO+1M_2(Zr_{1-y}Ti_y)O_3 \quad \text{Equation <6>}$$

If it ran completely to the end, equation <6> would mean a complete transition of the $M_2$ cations from the B-sites of the host lattice to the A-sites of the host lattice.

The formation of $PbNb_2O_6$, which is equivalent to 2 formula units of $Pb_{0.5}V_{Pb;0.5}NbO_3$, is connected with the last reaction equation. As a consequence of a mixed crystal formation with the PZT host lattice, there is a formation of lead vacancies on the A-sites of the doped PZT ceramic.

Corresponding to the specified reaction equations, a piezoelectric material is specified, wherein $(M_1)_4[(M_2)_{4/3}Nb_{8/3}]O_{12}$ is converted with the PZT host lattice at least in part into lead niobate.

In addition, a piezoelectric material is specified, wherein $(M_1)_4[(M_2)_{5/3}Nb_{7/3}]O_{11.5}V_{O;0.5}$ is converted with the PZT host lattice at least in part into $(M_1)_4[(M_2)_{4/3}Nb_{8/3}]O_{12}$.

In addition, a piezoelectric material is specified, wherein $(M_1)_4[(M_2)_2Nb_2]O_{11}V_O$ is converted with the PZT host lattice at least in part into $(M_1)_4[(M_2)_{5/3}Nb_{7/3}]O_{11.5}V_{O;0.5}$.

The specified reactions allow the adjustment of a very variable concentration of the oxygen vacancies. This elevation or reduction of the oxygen vacancy concentration can take place temperature-dependently, which offers a good possibility for the advantageous use of the oxygen vacancy variation in the sintering process of the ceramic material. This will be explained below.

An exothermic reaction course due to the stronger basicity of the alkaline-earth oxide can be based on the displacement of PbO from the PZT host lattice that takes place according to the above equations. This means that the equilibria shift at high temperatures in the direction of an elevated concentration of oxygen vacancies, whereby the sintering compression and grain growth of the ceramic are promoted. During cooling, the equilibria shift to the side of a reduction of the concentration of oxygen vacancies, which can lead to the complete elimination of such defects, which is advantageous for the functional stability of the PZT ceramic.

Based on the specified reaction equations, the distribution pattern of the defects installed in the PZT host lattice by the dopant can be controlled in the thermal treatment. Thereby the composition of the solid solution of PZT base material and dopant changes.

Accordingly, a piezoelectric material that contains a lead zirconate titanate ceramic, wherein the ceramic contains oxygen vacancies at lattice sites of the PZT lattice and wherein the concentration of the oxygen vacancies is temperature-dependent, is also specified.

According to one embodiment, a material in which the concentration of oxygen vacancies increases with rising temperature is additionally specified.

In a particularly preferred embodiment, the oxygen vacancy concentration runs largely temperature-dependently in a temperature range between 0 and 1200° C. This material has the advantage that the temperature dependency of the oxygen vacancy concentration can be made useful in a sintering process for manufacturing the ceramic material. The sintering temperature for the materials specified here lies between 900 and 1200° C.

According to a special embodiment of the piezoelectric material, the cation constituent is selected such that:

$$M_1=M_2=Sr.$$

From this, compounds from the above-described cryolite system according to the formula $Sr_4(Sr_{2-2x/3}Nb_{2+2x/3})O_{11+x}V_{O;1-x}$, result, wherein $0 \leqq x \leqq 1$. A part of the strontium cations here occupy the formal B-sites of component P. As a product of a reaction of component P with component D, the specified material can contain $Sr(Zr_{1-y}Ti_y)O_3$. This material can exist in the form of a solid solution with the PZT host lattice.

The reactions between the dopant and the PZT host lattice can run as follows in this case:

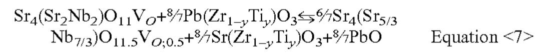

$$Sr_4(Sr_2Nb_2)O_{11}V_O+\tfrac{8}{7}Pb(Zr_{1-y}Ti_y)O_3 \leftrightarrows \tfrac{6}{7}Sr_4(Sr_{5/3}Nb_{7/3})O_{11.5}V_{O;0.5}+\tfrac{8}{7}Sr(Zr_{1-y}Ti_y)O_3+\tfrac{8}{7}PbO \quad \text{Equation <7>}$$

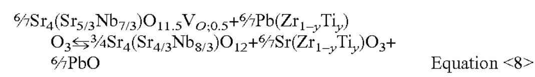

$$\tfrac{6}{7}Sr_4(Sr_{5/3}Nb_{7/3})O_{11.5}V_{O;0.5}+\tfrac{6}{7}Pb(Zr_{1-y}Ti_y)O_3 \leftrightarrows \tfrac{3}{4}Sr_4(Sr_{4/3}Nb_{8/3})O_{12}+\tfrac{6}{7}Sr(Zr_{1-y}Ti_y)O_3+\tfrac{6}{7}PbO \quad \text{Equation <8>}$$

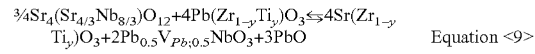

$$\tfrac{3}{4}Sr_4(Sr_{4/3}Nb_{8/3})O_{12}+4Pb(Zr_{1-y}Ti_y)O_3 \leftrightarrows 4Sr(Zr_{1-y}Ti_y)O_3+2Pb_{0.5}V_{Pb;0.5}NbO_3+3PbO \quad \text{Equation <9>}$$

According to a special embodiment of the material, the composition reads $P_{1-c-d}D_cZ_d[PbO]_m$, wherein D represents a cryolite compound with the formula $[(SrO)_a(Nb_2O_5)_{1-a}]$ with $a=29/35$, which can be expressed by the equivalent cryolite notation, $$Sr_4(Sr_{5/3}Nb_{7/3})O_{11.5}V_{0;0.5}, \text{ wherein:}$$

$$0<c \leqq 0.15 \text{ and } 0 \leqq m \leqq 0.05, d=0.$$

Here the subranges $0<c \leqq 0.025$ and $0.0255<c<0.0443$ are possible for c.

In a particularly special embodiment, a material is specified which has, for $1-y=0.53$ with $c=0.005$ and $m=0.01$, a composition according to the formula:

$$[Pb(Zr_{0.53}Ti_{0.47})O_3]_{0.973}[Sr_4(Sr_{4/3}Nb_{8/3})O_{12}]_{0.00213}$$

$$[Sr(Zr_{0.53}Ti_{0.47})O_3]_{0.017}[PbV_{Pb}(Nb_2O_6)]_{0.003}(PbO)_{0.029}.$$

In the ceramic material with the specially specified formula, roughly 10% of the strontium cations occupy the formal B-sites of the PZT host lattice.

According to another embodiment, a piezoelectric material with the composition $P_{1-c-d}D_cZ_d[PbO]_m$ is specified, wherein D represents a cryolite compound according to the formula $[(BaO)_{1-p}(CaO)_p]_a(Nb_2O_5)_{1-a}]$ with $a=29/35$ and $p=7/24$, which can be expressed by the equivalent cryolite notation $Ba_4(Ca_{5/3}Nb_{7/3})O_{11.5}V_{0;0.5}$, wherein:

$$0<c \leqq 0.15 \text{ and } 0 \leqq m \leqq 0.05, d=0.$$

Here the subranges $0<c \leqq 0.025$ and $0.0255<c<0.0443$ are possible for c.

According to a particularly special formulation, a material is specified that, for $1-y=0.53$ with $c=0.005$ and $m=0.01$, has a composition according to the formula:

$$[Pb(Zr_{0.53}Ti_{0.47})O_3]_{0.973}[Ba_4(Ca_{4/3}Nb_{8/3})O_{12}]_{0.00213}$$

$$[Ba(Zr_{0.53}Ti_{0.47})O_3]_{0.0115}[Ca(Zr_{0.53}Ti_{0.47})O_3]_{0.0055}$$

$$[PbV_{Pb}(Nb_2O_6)]_{0.003}(PbO)_{0.029}.$$

In this case roughly 34% of the calcium cations occupy formal B-sites of the PZT host lattice.

The case $M_1=M_2=Sr$ will once again be described in detail below.

According to one embodiment, a strontium niobate mixture according to the formula $(SrO)_a(Nb_2O_5)_{1-a}$ in the range $1>a>2/3$ is used as a dopant for the PZT ceramic. A contraction of $NbO_{6/2}$ octahedra is connected with the installation of $Nb^{5+}$ cations on B-sites of the perovskite structure of the PZT host lattice, whereby a widening of adjacent oxygen octahedra results and, connected thereto, the installation of relatively large Sr cations on B-sites of the PZT host lattice with the coordination number=6 is made possible.

It must be noted here that $(SrO)_a(Nb_2O_5)_{1-a}$ can interact with the lead zirconium titanate host lattice, forming strontium zirconium titanate (SZT), and can form $Pb(Nb_2O_6)$ within the range 1>a>⅔(this corresponds to $Pb_{0.5}V_{Pb;0.5}NbO_3$), which dissolves in the PZT host lattice with lead vacancies ($V_{Pb}$) at the formal A-sites as well as SZT, forming mixed crystals. This takes place according to the following reaction equation:

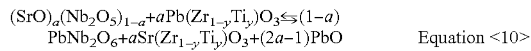

$$(SrO)_a(Nb_2O_5)_{1-a}+aPb(Zr_{1-y}Ti_y)O_3 \leftrightarrows (1-a)PbNb_2O_6+aSr(Zr_{1-y}Ti_y)O_3+(2a-1)PbO$$ Equation <10>

In the range 1>a>6/7, $(SrO)_a(Nb_2O_5)_{1-a}$ reacts with PZT until a=6/7 is reached, with liberation of PbO, which is added to the 0.1-5 mol % PbO generally already present in the mixture, and acts as a sintering aid.

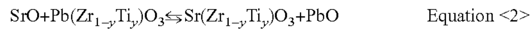

$$SrO+Pb(Zr_{1-y}Ti_y)O_3 \leftrightarrows Sr(Zr_{1-y}Ti_y)O_3+PbO$$ Equation <2>

For the case where a=6/7, there is the option of a mixed crystal formation in the PZT host lattice with the cryolite compound $Sr_4(Sr_2Nb_2)O_{11}V_{O;1}$, wherein Sr ions are contained on B-sites as well as on oxygen vacancies. The cooperation of this cryolite compound in the PZT/dopant mixed-crystal system takes effect in the entire range with the limits 1>a>6/7, i.e., the possibility of occupation of B-sites by Sr cations in the PZT host lattice always accompanies the installation of Nb cations.

Due to a mixed crystal formation with the PZT perovskite host lattice, the cryolite system with the formula $Sr_4(Sr_{2-2x/3}Nb_{2+2x/3})O_{11+x}V_{O;1-x}$ with a phase range within the range $0 \leqq x \leqq 1$ is particularly suited to the doping of PZT ceramics. For mixtures according to the general formula $(SrO)_a(Nb_2O_5)_{1-a}$, the phase range of the cryolite system is determined by the limits 6/7≧a≧4/5. A variable concentration of oxygen vacancies $V_O$ accompanies this variable composition inside the phase range. With the limit composition x=0 (in this case a=6/7) for example, the solid solution of $Sr_4(Sr_2Nb_2)O_{11}V_{O;1}$ in the PZT host lattice results, with a comparatively high oxygen vacancy concentration of $[V_O]=1$. For x=½(in this case a=34/41), a mean oxygen vacancy concentration of $[V_O]=0.5$ follows, with the corresponding formula $Sr_4(Sr_{5/3}Nb_{7/3})O_{11}V_{O;0.5}$. In the case of the limit composition with x=1 (in this case a=4/5), which corresponds to the formula $Sr_4(Sr_{4/3}Nb_{8/3})O_{12}$, no more oxygen vacancies are left, because there is now a valence compensation on the B-sites that includes an occupation of B-sites by Sr cations.

For the dopant with the composition $(SrO)_a(Nb_2O_5)_{1-a}$ in the range of 4/5≧a≧⅔, the formation of the compound $Pb_{0.5}V_{Pb;0.5}NbO_3$ with lead vacancies ($V_{Pb}$) on the A-sites of the PZT-perovskite mixed crystal comes about because the content of $Nb_2O_5$ exceeds the limit composition of the cryolite system, with a part of the lead oxide (PbO) added as a sintering aid being bound. The displacement of PbO by SrO in the doped PZT mixed-crystal system as described in equations <7>, <8> and <9> is produced by the basicity difference of PbO and SrO. The exothermic character of the acid-base reaction has the consequence that, with rising temperature (e.g., during sintering), the above-described equilibrium reactions shift towards the side of the reactants, i.e., towards the left side of the equilibrium reactions. One advantage of this largely temperature-dependent equilibrium shift is that the formation of an (at least temporarily) elevated oxygen vacancy concentration during sintering is promoted as a consequence of the doping with $(SrO)_a(Nb_2O_5)_{1-a}$ in the range 1>a>⅔, which has a very positive effect on sintering compression and the formation of an optimized structural texture of the ceramic. During the cool-down after sintering, the equilibrium reactions are shifted towards the side of the products, i.e., the right-hand side of the equilibrium reaction, with the excretion of an amount of PbO equivalent to the degree of doping. Particularly advantageous here is the simultaneous considerable reduction or even elimination of elevated oxygen vacancy concentration, which is unfavorable for the long-term stability of the piezoelectric material, particularly during use in an electric field. The interaction of the dopant in the solid solution with the PZT host lattice can include the complete migration of the Sr cations from the formal B-sites to the formal A-sites, i.e., partial substitution of Pb cations with coordination number=12.

The proportion of Sr cations after heat processing on both the formal A-sites (coordination number=12) and on the formal B-sites (coordination number=6) in the piezoelectric materials described here was analyzed and quantified by means of high-resolution solid-state analytical measurement methods. Remarkably high concentrations of Sr cations on the formal B-sites, e.g., a proportion of roughly 10% of the entire content of Sr, were unambiguously detected. One conclusion of these studies is that during cooling after sintering, the specified reaction according to equation <9> does not run completely to the side of the reaction products.

With a nearly complete elimination of the oxygen vacancies in PZT ceramic doped with $(SrO)_a(Nb_2O_5)_{1-a}$ in the range 1>a>⅔, a considerable proportion of the total strontium content remains on the B-sites of the perovskite mixed crystal of the piezoelectric material, whereby the outstanding material properties, particularly for use in piezoelectric multilayer actuators, originate.

In addition, a piezoelectric material is specified which further contains the additive component Z in the PZT mixed-crystal system. The modification and adaptation of the piezoelectric properties to predetermined values is thereby made possible. The additive component Z can comprise the compounds listed below:

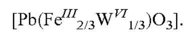

$[Pb(Fe^{III}_{2/3}W^{VI}_{1/3})O_3]$.

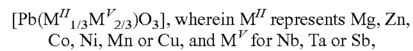

$[Pb(M^{II}_{1/3}M^{V}_{2/3})O_3]$, wherein $M^{II}$ represents Mg, Zn, Co, Ni, Mn or Cu, and $M^V$ for Nb, Ta or Sb,

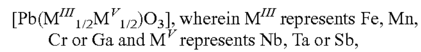

$[Pb(M^{III}_{1/2}M^{V}_{1/2})O_3]$, wherein $M^{III}$ represents Fe, Mn, Cr or Ga and $M^V$ represents Nb, Ta or Sb,

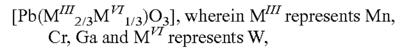

$[Pb(M^{III}_{2/3}M^{VI}_{1/3})O_3]$, wherein $M^{III}$ represents Mn, Cr, Ga and $M^{VI}$ represents W,

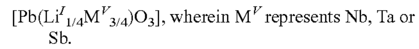

$[Pb(Li^{I}_{1/4}M^{V}_{3/4})O_3]$, wherein $M^V$ represents Nb, Ta or Sb.

The piezoelectric material can additionally be free of $[Pb(Fe^{III}_{2/3}W^{VI}_{1/3})O_3]$.

Furthermore, a piezoelectric multilayer actuator that comprises at least one dielectric layer and at least two internal electrodes, wherein at least one dielectric layer contains a piezoelectric material as described here, is specified.

In addition, a method for manufacturing a piezoelectric component is described, wherein the component contains the material described here, wherein the concentration of the oxygen vacancies is increased during the sintering and again lowered during the cooling of the ceramic material.

The material will be explained in detail with the following examples.

Example 1

The doping of a PZT ceramic according to $Pb(Zr_{0.53}Ti_{0.47})O_3$ with, for example, 3.425 mol % $(SrO)_{34/41}(Nb_2O_5)_{7/41}$ (this corresponds to 0.5 mol % $[Sr_4(Sr_{5/3}Nb_{7/3})O_{11.5}V_{O;0.5}]$) and addition of 1 mol % PbO corresponding to the formula $$[Pb(Zr_{0.53}Ti_{0.47})O_3]_{0.995}[Sr_4(Sr_{5/3}Nb_{7/3})O_{11.5}V_{O;0.5}]_{0.005}$$

$$[PbO]_{0.01}$$

leads during the thermal processing to a piezoelectric ceramic according to the formula $$[Pb(Zr_{0.53}Ti_{0.47})O_3]_{0.973}[Sr_4(Sr_{4/3}Nb_{8/3})O_{12}]_{0.00213}$$

$$[Sr(Zr_{0.53}Ti_{0.47})O_3]_{0.017}[PbV_{Pb}(Nb_2O_6)]_{0.003}(PbO)_{0.029}$$

wherein the components in square brackets are soluble in one another, forming a perovskite mixed-crystal phase, and oxygen vacancies are present only in negligibly small concentrations. As a consequence of the displacement of PbO by SrO in conjunction with a release of $Nb_2O_5$, a formation of lead vacancies ($V_{Pb}$) on the formal A-sites (Pb-sites) occurs, and ca. 10% of the overall strontium content remains on the formal B-sites (Zr/Ti sites) in the vicinity of Nb cations with coordination number 6.

Example 2

With respect to the dopant according to the formula $(SrO)_a(Nb_2O_5)_{1-a}$ in the range 1>a ⅔, related systems that have a similar structural constitution can be used alternatively or additionally. For example, compounds according to the formula $[(BaO)_{1-p}(CaO)_p]_a[Nb_2O_5]_{1-a}$ in the range 1>a>⅔ with 1<p<0 can be used. In this case, in the range $6/7 \geqq a \geqq 4/5$ with appropriately associated parameter p in the range $1/3 \geqq p \geqq 1/4$, a mixed-crystal phase is formed between the cryolite system according to the formula $Ba_4(Ca_{2-2x/3}Nb_{2+2x/3})O_{11+x}V_{O;1-x}$ with $0 \leqq x \leqq 1$ as a dopant and PZT as the host lattice. The dopant in the mixed crystal is subject to temperature-dependent equilibrium reactions similar to those described in equations <4> through <6>.

In the range $1>a>6/7$ with $1 \geqq p \geqq 0$, compounds according to the formula $[(BaO)_{1-p}(CaO)_p]_a[Nb_2O_5]_{1-a}$ react with PZT analogously to the reaction equations <1a> and <1b> until, when a=6/7 is reached with p=⅓, a PZT mixed-crystal phase is formed, with $Ba_4(Ca_2Nb_2)O_{11}V_O$, a compound that appears in the cryolite type of structure with Ca cations on B-sites and contains oxygen vacancies VO. The cooperation of this cryolite component in the PZT/dopant mixed-crystal system takes effect in the entire range inside the limits 1>a>6/7, i.e., the installation of Nb cations on formal B-sites is always accompanied by the possibility of the occupation by Ca cations on B-sites. Temperature-dependent reactions analogous to equations <4> through <6> must also be taken into account.

For example, the doping of a PZT ceramic according to the formula $Pb(Zr_{0.52}Ti_{0.48})O_3$ with 3.425 mol % $[(BaO)_{12/17}(CaO)_{5/17}]_{34/41}[Nb_2O_5]_{7/41}$ (corresponding to 0.5 mol % $[Ba_4(Ca_{5/3}Nb_{7/3})O_{11.5}V_{0.5}]$) and addition of 1 mol % PbO corresponding to the formula $$[Pb(Z_{0.52}Ti_{0.48})O_3]_{0.995}[Ba_4(Ca_{5/3}Nb_{7/3})O_{11.5}V_{0.5}]_{0.005}$$

$$[PbO]_{0.01}$$

yields, during thermal processing, a piezoelectric ceramic according to the formula $$[Pb(Zr_{0.52}Ti_{0.48})O_3]_{0.973}[Ba_4(Ca_{4/3}Nb_{8/3})O_{12}]_{0.00213}$$

$$[Ba(Zr_{0.52}Ti_{0.48})O_3]_{0.0115}[Ca(Zr_{0.52}Ti_{0.48})O_3]_{0.0055}$$

$$[PbV_{Pb}(Nb_2O_6)]_{0.003}(PbO)_{0.029}$$

wherein ca. 34% of the entire calcium content is installed on the formal B-sites of the perovskite mixed crystal.

In place of $[(BaO)_{1-p}(CaO)_p]_a[Nb_2O_5]_{1-a}$ in the range 1>a>⅔, a material system according to the formula $[(BaO)_{1-p}(SrO)_p]_a[Nb_2O_5]$ or a material system according to the formula $[(SrO)_{1-p}(CaO)_p]_a[Nb_2O_5]$ can analogously be used as a dopant, wherein the compounds formed in the range $6/7 \geqq a \geqq 4/5$ with appropriately assigned parameter p in the range $1/3 \geqq p \geqq 1/4$ from the cryolite systems $$Ba_4(Ca_{2-x}/3Nb_{2+2x/3})O_{11+x}V_{O;1-x} \text{ or } Sr_4(Ca_{2-2x/3}Nb_{2+2x/3})O_{11+x}V_{O;1-x} \text{ with } 0 \leqq x \leqq 1$$

dissolve in the PZT host lattice, forming a mixed crystal, and can enter into a reaction with PZT in temperature-dependent equilibrium reactions analogous to equations <4> through <6>.

To produce the piezoelectric material described here, a mixture of $Pb_3O_4$ or $PbCO_3$ with $TiO_2$ and $ZrO_2$ or optionally a $(Zr_{1-y}Ti_y)O_2$ precursor, as well as $SrCO_3$ and $Nb_2O_5$, and other additives such as $Pb(Fe^{III}_{2/3}W^{VI}_{1/3})O_3$, if appropriate, are provided. Exemplary compositions are presented in Tables 1 and 2. Alternatively, $SrCO_3$ can also be replaced by a corresponding content of $BaCO_3$ or $CaCO_3$, or $BaCO_3$ is used instead of $SrCO_3$ as raw material in a proportional combination with $SrCO_3$ or $CaCO_3$. Alternatively, a mixture can also be used in which the alkaline-earth carbonates are replaced by alkaline-earth titanates such as $SrTiO_3$, $BaTiO_3$ or $CaTiO_3$ or by adding to the mixture, according to the desired composition, the respective proportion of prefabricated compound from the above-described cryolite compounds such as those according to the formulas $$Sr_4(Sr_{2-2x/3}Nb_{2+2x/3})O_{11+x}V_{O;1-x},$$

$$Ba_4(Sr_{2-2x/3}Nb_{2+2x/3})O_{11+x}V_{O;1-x},$$

$$Ba_4(Ca_{2-2x/3}Nb_{2+2x/3})O_{11+x}V_{O;1-x} \text{ or}$$

$$Sr_4(Ca_{2-2x/3}Nb_{2+2x/3})O_{11+x}V_{O;1-x} \text{ with } 0 \leqq x \leqq 1.$$

Exemplary compositions of materials with partial doping of Sr or Ca cations on formal B-sites in the resulting PZT mixed-crystal phase with perovskite structure are listed in Tables 1 and 2.

Insofar as two numerical values are listed for the parameter d, these are to be viewed in combination with the other parameter values in the same row as separate embodiments.

TABLE 1

| $[Pb(Zr_{1-y}Ti_y)O_3]_{1-c}[(Sro)_a(Nb_2O_5)_{1-a}]_c \bullet 0.01\ PbO$ | | |
|---|---|---|
| 1 − y = 0.53 | a = 34/41 | c = 0.0255 |
| 1 − y = 0.53 | a = 34/41 | c = 0.0342 |
| 1 − y = 0.53 | a = 34/41 | c = 0.0443 |
| 1 − y = 0.535 | a = 34/41 | c = 0.0255 |
| 1 − y = 0.535 | a = 34/41 | c = 0.0342 |
| 1 − y = 0.535 | a = 34/41 | c = 0.0443 |

| $[Pb(Zr_{1-y}Ti_y)O_3]_{1-c-d}[Pb(Fe^{III}_{2/3}W^{VI}_{1/3})O_3]_d$ $[(Sro)_a(Nb_2O_5)_{1-a}]_c \bullet 0.01\ PbO$ | | | |
|---|---|---|---|
| 1 − y = 0.53 | a = 34/41 | c = 0.0255 | d = 0.003 or 0.008 |
| 1 − y = 0.53 | a = 34/41 | c = 0.0342 | d = 0.003 or 0.008 |
| 1 − y = 0.53 | a = 34/41 | c = 0.0443 | d = 0.003 or 0.008 |
| 1 − y = 0.535 | a = 34/41 | c = 0.0255 | d = 0.003 or 0.008 |
| 1 − y = 0.535 | a = 34/41 | c = 0.0342 | d = 0.003 or 0.008 |
| 1 − y = 0.535 | a = 34/41 | c = 0.0443 | d = 0.003 or 0.008 |

TABLE 2

| $[Pb(Zr_{1-y}Ti_y)O_3]_{1-c}\{[(BaO)_{1-p}(CaO)_p]_a[Nb_2O_5]_{1-a}\}c \cdot 0.01\ PbO$ | | | |
|---|---|---|---|
| 1 − y = 0.53 | a = 34/41 | c = 0.0255 | p = 5/17 |
| 1 − y = 0.53 | a = 34/41 | c = 0.0342 | p = 5/17 |
| 1 − y = 0.53 | a = 34/41 | c = 0.0443 | p = 5/17 |
| 1 − y = 0.535 | a = 34/41 | c = 0.0255 | p = 5/17 |
| 1 − y = 0.535 | a = 34/41 | c = 0.0342 | p = 5/17 |
| 1 − y = 0.535 | a = 34/41 | c = 0.0443 | p = 5/17 |

| $[Pb(Zr_{1-y}Ti_y)O_3]_{1-c-d}[Pb(Fe^{III}_{2/3}W^{VI}_{1/2})O_3]_d\{[(BaO)_{1-p}(CaO)_p]_a[Nb_2O_5]_{1-a}\}_c \cdot 0.01\ PbO$ | | | | |
|---|---|---|---|---|
| 1 − y = 0.53 | a = 34/41 | c = 0.0255 | p = 5/17 | d = 0.003 or 0.008 |
| 1 − y = 0.53 | a = 34/41 | c = 0.0342 | p = 5/17 | d = 0.003 or 0.008 |
| 1 − y = 0.53 | a = 34/41 | c = 0.0443 | p = 5/17 | d = 0.003 or 0.008 |
| 1 − y = 0.535 | a = 34/41 | c = 0.0255 | p = 5/17 | d = 0.003 or 0.008 |
| 1 − y = 0.535 | a = 34/41 | c = 0.0342 | p = 5/17 | d = 0.003 or 0.008 |
| 1 − y = 0.535 | a = 34/41 | c = 0.0443 | p = 5/17 | d = 0.003 or 0.008 |

Such mixtures are preferably adjusted to the morphotropic phase boundary (MPB) in relation to the Zr to Ti ratio, and an excess of PbO as a sintering aid is added if needed.

After dry or wet-chemical homogenization, the mixtures are typically calcined at 900-1000° C. The sintering activity can be adjusted to the desired sintering temperature, e.g., in the range of 900-1200° C., with the aid of fine grinding.

Using auxiliary agents such as dispersants and possibly other additives, the obtained powdered material is converted into a powder suspension with typically ca. 50-80% solids content. It can then be converted into pressable granular material by spray drying, for example, or can be processed directly into green ceramic films. To adjust the properties necessary for further processing, typically 2-15% binders as well as further additives if needed can be added to the powder suspensions.

Disc-shaped pellets of powdered granular material are produced as specimen bodies, while rectangular multilayer plates, referred to below as MLPs are prepared by stacking and laminating green films. Binder is removed from the sample bodies by the usual methods and processes. Piezoelectric multilayer actuators, which can contain up to several hundred internal electrodes, also serve as sample bodies. In the case of Cu or other non-noble metals, attention must be paid to precise monitoring and control of the furnace atmosphere during thermal processing in order to prevent an oxidation of the internal electrodes or a reduction of the ceramic.

The above-described piezoelectric materials allow a high sintering compression into ceramics with a textural structure that is very advantageous for the piezoelectric and electromechanical properties. After the specimen bodies have been provided with contacts, by sputtering for example, the dielectric and especially the piezoelectric properties are measured. For piezoelectric multilayer actuators, the contacts are advantageously provided by application and baking of suitable metal pastes. The piezoelectric materials with a Curie temperature in the range of ca. $T_C \approx 250\text{-}380°$ C. are typically polarized at ca. 2 kV/mm.

Some of the measurement values and properties obtained with different sample bodies of this type are compiled for the sake of example in Tables 3-7.

In addition to the dielectric constant ∈, the expansion S according to the relationship $S_3 = d_{33} \times E_3$, which holds for the piezoelectric effect under the action of the electric field intensity E, was measured to obtain the piezoelectric constant $d_3$, where the index “3” describes the direction of the axis established by the polarization as well as the applied field intensity. The measured values for the dielectric loss are also indicated.

The loss is the ratio of electrical loss energy to the total electrical energy, and is derived from the surface area enclosed by the measured hysteresis curve.

TABLE 3

Small-signal and large-signal measurement values for disk MLP specimens (diameter: 13 mm, height: 1 mm) and for multilayer actuators (350 Ag/Pd internal electrodes, thickness of the dielectric layers: 80 μm, actuator surface area: 3.5 × 3.5 mm²) with piezoelectric material of the invention according to the formula: $[Pb(Zr_{1-y}Ti_y)O_3]_{0.973}[Sr_4(Sr_{4/3}Nb_{8/3})O_{12}]_{0.00213}[Sr(Zr_{1-y}Ti_y)O_3]_{0.017}[PbV_{Pb}(Nb_2O_6)]_{0.003}(PbO)_{0.029}$

| 1 − y | Specimen | Field strength [V/mm] | ϵ | $d_{33}$ [pm/V] | Loss |
|---|---|---|---|---|---|
| 0.52 | MLP | 2000 | 2588 | 634 | 0.455 |
| 0.525 | MLP | 2000 | 2672 | 658 | 0.445 |
| 0.53 | MLP | 2000 | 2687 | 677 | 0.446 |
| 0.535 | MLP | 2000 | 1851 | 599 | 0.431 |
| 0.54 | MLP | 2000 | 2206 | 650 | 0.451 |
| 0.52 | MLP | 1 | 1598 | | 0.154 |
| 0.525 | MLP | 1 | 1670 | | 0.0150 |
| 0.53 | MLP | 1 | 1419 | | 0.0193 |
| 0.535 | MLP | 1 | 1070 | | 0.0206 |
| 0.54 | MLP | 1 | 1341 | | 0.0184 |
| 0.52 | Actuator | 2000 | 3379 | 701 | 0.408 |
| 0.52 | Actuator | 1 | 1669 | | 0.0222 |

TABLE 4

Small-signal and large-signal measurement values for disc-shaped MLP specimens (diameter: 13 mm, height 1 mm) with piezoelectric material according to the formula: $[Pb(Zr_{1-y}Ti_y)O_3]_{0.974}[Sr_4(Sr_{4/3}Nb_{8/3})O_{12}]_{0.00183}[Sr(Zr_{1-y}Ti_y)O_3]_{0.0146}[PbV_{Pb}(NbO_3)]_{0.0097}(PbO)_{0.01}$

| 1 − y | Specimen | Field strength [V/mm] | ϵ | $d_{33}$ [pm/V] | Loss |
|---|---|---|---|---|---|
| 0.53 | MLP | 2000 | 2724 | 659 | 0.476 |
| 0.53 | MLP | 1 | 2881 | 722 | 0.469 |

TABLE 5

Small-signal and large-signal measurement values for disc-shaped MLP specimens (diameter: 13 mm, height 1 mm) with piezoelectric material according to the formula: $[Pb(Zr_{1-y}Ti_y)O_3]_{0.973}[Sr_4(Sr_{4/3}Nb_{8/3})O_{12}]_{0.0020}[Sr(Zr_{1-y}Ti_y)O_3]_{0.0161}[PbV_{Pb}(NbO_3)]_{0.0117}(PbO)_{0.0078}$

| 1 − y | Specimen | Field strength [V/mm] | ϵ | $d_{33}$ [pm/V] | Loss |
|---|---|---|---|---|---|
| 0.53 | MLP | 2000 | 2667 | 631 | 0.440 |
| 0.53 | MLP | 1 | 1683 | | 0.0165 |

TABLE 6

Small-signal and large-signal measurement values for disc-shaped MLP specimens (diameter: 13 mm, height 1 mm) with piezoelectric material according to the formula: $[Pb(Zr_{1-y}Ti_y)O_3]_{0.973}[Sr_4(Sr_{4/3}Nb_{8/3})O_{12}]_{0.0020}[Sr(Zr_{1-y}Ti_y)O_3]_{0.0161}[PbV_{Pb}(NbO_3)]_{0.0093}(PbO)_{0.010}$

| 1 − y | Specimen | Field strength [V/mm] | ϵ | $d_{33}$ [pm/V] | Loss |
|---|---|---|---|---|---|
| 0.535 | MLP | 2000 | 2870 | 674 | 0.497 |
| 0.535 | MLP | 1 | 1698 | | 0.0167 |

TABLE 7

Small-signal and large-signal measurement values for disc-shaped MLP specimens (diameter: 13 mm, height 1 mm) with piezoelectric material according to the formula: $[Pb(Zr_{1-y},Ti_y)O_3]_{0.973}[Sr_4(Sr_{4/3}Nb_{8/3})O_{12}]_{0.0020}[Sr(Zr_{1-y},Ti_y)O_3]_{0.0161}[PbV_{Pb}(NbO_3)]_{0.0093}(PbO)_{0.010}$

| 1 − y | Specimen | Field strength [V/mm] | ϵ | $d_{33}$ [pm/V] | Loss |
|---|---|---|---|---|---|
| 0.535 | MLP | 2000 | 2881 | 722 | 0.469 |
| 0.535 | MLP | 1 | 1727 | | 0.0181 |

TABLE 8

Small-signal and large-signal measurement values for disc-shaped MLP specimens (diameter: 13 mm, height 1 mm) with piezoelectric material according to the formula: $[Pb(Zr_{1-y},Ti_y)O_3]_{0.973}[Ba_4(Ca_{4/3}Nb_{8/3})O_{12}]_{0.00213}[Ba(Zr_{1-y},Ti_y)O_3]_{0.0115}[Ca((Zr_{1-y},Ti_y)O_3]_{0.0055}[Pb_{0.5}V_{Pb;\,0.5}(NbO_3)]_{0.006}(PbO)_{0.02}$

| 1 − y | Specimen | Field strength [V/mm] | ϵ | $d_{33}$ [pm/V] | Loss |
|---|---|---|---|---|---|
| 0.535 | MLP | 2000 | 2609 | 610 | 0.510 |
| 0.535 | MLP | 1 | 1228 | | 0.0201 |

By the appropriate selection of the ions for $M_1$ and $M_2$ and of parameters a, p and c, values for the dielectric constants and the piezoelectric constant $d_{33}$ can be achieved which could previously only be achieved by the addition of another component. For example, $KNbO_3$ or complexes that contain additional (heavy) metals such as Fe were contained as additional components.

The materials used for the measurements of Tables 3-8, on the other hand, preferably consist exclusively of the components P, D PbO and their reaction products. In these cases it was possible to forgo the addition of another component Z entirely (d=0).

What is claimed is:

1. A piezoelectric material comprising:

a material with the molecular formula $P_{1-c-d}D_cZ_d$, wherein $0<c\leqq 0.15$ and $0\leqq d\leqq 0.5$, wherein P represents the composition $Pb(Zr_{1-y},Ti_y)O_3$, where $0.50\leqq 1-y\leqq 0.60$, wherein Z represents an additional component of the perovskite type of structure, wherein D represents a material according to the general formula $[(M_1O)_{1-p}(M_2O)_p]_a[Nb_2O_5]_{1-a}$, wherein $M_1$ represents $Ba_{1-t}Sr_t$ with $0\leqq t\leqq 1$, $M_2$ represents strontium, $2/3<a<1$ and $0<p<1$, and wherein the material D contains a cryolite type of structure.

2. The piezoelectric material according to claim 1, wherein $0<c\leqq 0.025$.

3. The piezoelectric material according to claim 1, wherein $0.0255<c<0.0443$.

4. The piezoelectric material according to claim 1, wherein the material contains a mixed crystal comprising the component P with the structure of the perovskite type $ABO_3$ as the host lattice and the component D, wherein at least a part of the $M_2$ cations occupy the formal B-sites of a PZT perovskite host lattice of the material.

5. The piezoelectric material according to claim 1, wherein $6/7<a<1$.

6. The piezoelectric material according to claim 1, wherein $2/3<a<4/5$.

7. The piezoelectric material according to claim 1, wherein $4/5\leqq a\leqq 6/7$ and $1/4\leqq p\leqq 1/3$, wherein the component D has the general formula $$(M_1)_4[(M_2)_{2-2x/3}Nb_{2+2x/3}]O_{11}+_xV_{O;1-x}$$

where $0\leqq x\leqq 1$, $V_O$ represents oxygen vacancies, and $a=22/35+24p/35$ and $a=6/7-2x/35$, and wherein the component D with cryolite structure forms a solid solution with a PZT host lattice of the material.

8. The piezoelectric material according to claim 1, wherein the material additionally contains up to 5 mol % PbO.

9. The piezoelectric material according to claim 1, wherein a cryolite compound according to the formula $(M_1)_4[(M_2)_2Nb_2]O_{11}V_{O;1}$ forms a solid solution with a PZT host lattice of the material.

10. The piezoelectric material according to claim 1, wherein the cryolite compound is a constituent of component D and the excess of MO of component D is reacted at least in part with component P to form $M(Zr_{1-y},Ti_y)O_3$ and PbO, wherein M represents $M_1$ or $M_2$.

11. The piezoelectric material according to claim 1, wherein a cryolite compound according to the formula $(M_1)_4[(M_2)_{4/3}Nb_{8/3}]O_{12}$ forms a solid solution with a PZT host lattice of the material.

12. The piezoelectric material according to claim 1, wherein the cryolite compound is a constituent of component D, and the excess of $Nb_2O_5$ of component D is reacted at least in part with additionally present PbO into lead niobate.

13. The piezoelectric material according to claim 1, wherein the material contains $M(Zr_{1-y},Ti_y)O_3$ as a product of a reaction of component D with the PZT host lattice, wherein M represents $M_1$ or $M_2$.

14. The piezoelectric material according to claim 1, wherein $(M_1)_4[(M_2)_{4/3}Nb_{8/3}]O_{12}$ is converted with the PZT host lattice at least in part into lead niobate.

15. The piezoelectric material according to claim 1, wherein $(M_1)_4[(M_2)_{5/3}Nb_{7/3}]O_{11.5}V_{O;0.5}$ is converted with the PZT host lattice at least in part into $(M_1)_4[(M_2)_{4/3}Nb_{8/3}]O_{12}$.

16. The piezoelectric material according to claim 1, wherein $(M_1)_4[(M_2)_2Nb_2]O_{11}V_{O;1}$ is converted with the PZT host lattice at least in part into $(M_1)_4[(M_2)_{5/3}Nb_{7/3}]O_{11.5}V_{O;0.5}$.

17. The piezoelectric material according to claim 1, wherein, for component D: $M_1=M_2=Sr$, from which a cryolite compound according to the formula $$Sr_4(Sr_{2-2x/3}Nb_{2+2x/3})O_{11+x}V_{O;1-x}\text{ results,}$$

wherein: $0\leqq x\leqq 1$, wherein a part of the Sr cations occupy the formal B-sites of the perovskite host lattice of component P.

18. The piezoelectric material according to claim 1, wherein the material contains $Sr(Zr_{1-y},Ti_y)O_3$ as a product of a reaction of component P with component D.

19. The piezoelectric material according to claim 1, with the composition $$P_{1-c-d}D_cZ_d[PbO]_m.$$

wherein D represents a cryolite compound according to the formula $[(SrO)_a(Nb_2O_5)_{1-a}]$ with $a=29/35$, which can be expressed by the equivalent cryolite notation $Sr_4(Sr_{5/3}Nb_{7/3})O_{11.5}V_{0;0.5}$, wherein: $0<c\leqq 0.15$ and $0\leqq m\leqq 0.05$ and d=0.

20. The piezoelectric material according to claim 19, with the composition according to the formula:

$$[Pb(Zr_{0.53}Ti_{0.47})O_3]_{0.973}[Sr_4(Sr_{4/3}Nb_{8/3})O_{12}]_{0.00213}$$

$$[Sr(Zr_{0.53}Ti_{0.47})O_3]_{0.0017}[PbV_{Pb}(Nb_2O_6)]_{0.003}(PbO)_{0.029}.$$

21. The piezoelectric material according to claim 20, wherein about 10% of the strontium cations occupy formal B-sites of a PZT host lattice of the material.

22. The piezoelectric material according to claim 1, with the composition $$P_{1-c-d}D_cZ_d[PbO]_m,$$

wherein D represents a cryolite compound with the formula:

$$[(BaO)_{1-p}(CaO)_p]_a(Nb_2O_5)_{1-a}]$$

with $a=29/35$ and $p=7/24$, which can be expressed by the equivalent cryolite notation, $$Ba_4(Ca_{5/3}Nb_{7/3})O_{11.5}V_{O;0.5},$$

wherein: $0<c\leqq 0.15$ and $0\leqq m\leqq 0.05$ and $d=0$.

23. The piezoelectric material according to claim 22, with the composition according to the formula $$[Pb(Zr_{0.53}Ti_{0.47})O_3]_{0.973}[Ba_4(Ca_{4/3}Nb_{8/3})O_{12}]_{0.00213}$$

$$[Ba(Zr_{0.53}Ti_{0.47})O_3]_{0.0115}[Ca(Zr_{0.53}Ti_{0.47})O_3]_{0.0055}$$

$$[PbV_{Pb}(Nb_2O_6)]_{0.003}(PbO)_{0.029}.$$

24. The piezoelectric material according to claim 23, wherein about 34% of the calcium cations occupy formal B-sites of the PZT host lattice.

25. The piezoelectric material according to claim 1, which forms a mixed-crystal phase that contains an additional component Z.

26. The piezoelectric material according to claim 25, wherein the additional component comprises a compound according to the formula $[Pb(Fe^{III}_{2/3}W^{VI}_{1/3})O_3]$.

27. The piezoelectric material according to claim 25, wherein the additional component comprises a compound according to the formula $[Pb(M^{II}_{1/3}M^{V}_{2/3})O_3]$, wherein $M^{II}$ represents Mg, Zn, Co, Ni, Mn or Cu, and $M^{V}$ represents Nb, Ta or Sb.

28. The piezoelectric material according to claim 25, wherein the additional component comprises a compound according to the formula $[Pb(M^{III}_{1/2}M^{V}_{1/2})O_3]$, wherein $M^{III}$ represents Fe, Mn, Cr or Ga and $M^{V}$ represents Mb, Ta or Sb.

29. The piezoelectric material according to claim 25, wherein the additional component comprises a compound according to the formula $[Pb(M^{III}_{2/3}M^{VI}_{1/3})O_3]$, wherein $M^{III}$ represents Mn, Cr, Ga and $M^{VI}$ represents W.

30. The piezoelectric material according to claim 25, wherein the additional component comprises a compound according to the formula $[Pb(Li^{I}_{1/4}M^{V}_{3/4})O_3]$, wherein $M^{V}$ represents Nb, Ta or Sb.

31. The piezoelectric material according to claim 1, wherein the material is free of $[Pb(Fe^{III}_{2/3}W^{VI}_{1/3})O_3]$.

32. The piezoelectric material according to claim 1, wherein the material is free of $[Pb(Fe^{III}_{1/2}Nb_{1/2})O_3]$.

33. The piezoelectric material according to claim 1, wherein the material is free of $KNbO_3$.

34. The piezoelectric material according to claim 1, wherein the material is free of $Sr(K_{1/4}Nb_{3/4})O_3$.

35. The piezoelectric material according to claim 1, wherein about 10% of the M cations occupy formal B-sites of a PZT host lattice of the material, wherein M represents $M_1$ and/or $M_2$.

36. The piezoelectric material according to claim 1, wherein for $6/7<a<1$, the excess of MO of component D is reacted at least in part with component P to form $M(Zr_{1-y}Ti_y)O_3$ and PbO, wherein M represents $M_1$ or $M_2$.

37. The piezoelectric material according to claim 1, wherein for $2/3<a<4/5$, the excess of $Nb_2O_5$ of component D is reacted at least in part with additionally present PbO into lead niobate.

38. The piezoelectric material according to claim 1, wherein d=0.

39. A piezoelectric multilayer actuator comprising:

at least one dielectric layer; and at least two electrodes, wherein at least one dielectric layer contains a piezoelectric material according to claim 1.

40. A method for manufacturing a piezoelectric component, the method comprising:

sintering a material; and cooling the material wherein a piezoelectric material remains after the cooling, wherein a concentration of the oxygen vacancies is increased during the sintering and again lowered during the cooling of the material; and wherein the piezoelectric material has a molecular formula $P_{1-c-d}D_cZ_d$, wherein $0<c\leqq 0.15$ and $0\leqq d\leqq 0.5$, wherein P represents the composition $Pb(Zr_{1-y}Ti_y)O_3$, where $0.50\leqq 1-y<0.60$, wherein Z represents an additional component of the perovskite type of structure, wherein D represents a material according to the general formula $[(M_1O)_{1-p}(M_2O)_p]_a[Nb_2O_5]_{1-a}$, wherein $M_1$ represents $Ba_{1-t}Sr_t$ with $0\leqq t\leqq 1$, $M_2$ represents strontium, $2/3<a<1$ and $0<p<1$, and wherein the material D contains a cryolite type of structure.

41. A method of manufacturing a piezoelectric multilayer actuator, the method comprising:

forming a dielectric layer containing a piezoelectric material; and forming at least two electrodes adjacent the dielectric layer;

wherein the piezoelectric material has a molecular formula $P_{1-c-d}D_cZ_d$, wherein $0<c\leqq 0.15$ and $0\leqq d\leqq 0.5$, wherein P represents the composition $Pb(Zr_{1-y}Ti_y)O_3$, where $0.50\leqq 1-y<0.60$, wherein Z represents an additional component of the perovskite type of structure, wherein D represents a material according to the general formula $[(M_1O)_{1-p}(M_2O)_p]_a[Nb_2O_5]_{1-a}$, wherein $M_1$ represents $Ba_{1-t}Sr_t$ with $0\leqq t\leqq 1$, $M_2$ represents strontium, $2/3<a<1$ and $0<p<1$, and wherein the material D contains a cryolite type of structure.

* * * * *

UNITED STATES PATENT AND TRADEMARK OFFICE

CERTIFICATE OF CORRECTION

PATENT NO. : 7,999,448 B2
APPLICATION NO. : 12/552528
DATED : August 16, 2011
INVENTOR(S) : Feltz et al.

It is certified that error appears in the above-identified patent and that said Letters Patent is hereby corrected as shown below:

In Col. 16, line 27, claim 40, delete "the".

Signed and Sealed this
Eighth Day of November, 2011

David J. Kappos
*Director of the United States Patent and Trademark Office*